United States Patent [19]
Nguyen et al.

[11] Patent Number: 5,843,846
[45] Date of Patent: Dec. 1, 1998

[54] ETCH PROCESS TO PRODUCE ROUNDED TOP CORNERS FOR SUB-MICRON SILICON TRENCH APPLICATIONS

[75] Inventors: Phi L. Nguyen, Hillsboro; Ralph A. Schweinfurth, Beverton, both of Oreg.

[73] Assignee: Intel Corporation, Santa Clara, Calif.

[21] Appl. No.: 775,573

[22] Filed: Dec. 31, 1996

[51] Int. Cl.⁶ .................................................. H01L 21/302
[52] U.S. Cl. .................... 438/713; 438/723; 438/724; 438/734; 438/719
[58] Field of Search .................................. 438/701, 713, 438/723, 724, 734, 719

[56] References Cited

U.S. PATENT DOCUMENTS

| | | | |
|---|---|---|---|
| 5,176,790 | 1/1993 | Arleo et al. | 156/643 |
| 5,269,879 | 12/1993 | Rhoades et al. | 156/643 |
| 5,453,403 | 9/1995 | Meng et al. | 437/195 |
| 5,468,339 | 11/1995 | Gupta et al. | 216/67 |
| 5,514,247 | 5/1996 | Shan et al. | 156/643.1 |
| 5,668,038 | 9/1997 | Huang et al. | 438/396 |

FOREIGN PATENT DOCUMENTS

| | | |
|---|---|---|
| 57-136327 | 8/1982 | Japan . |
| 8-124898 | 5/1996 | Japan . |
| 8-250480 | 9/1996 | Japan . |

OTHER PUBLICATIONS

"Silicon Deep—Trench Etching Using Freon 12 Plus Inert Gas Plasmas"; Bennett et. al.; Jan. 1985; IBM Tech. Discl. Bulletin; vol. 27, No. 8; pp. 4680–4681.

*Primary Examiner*—R. Bruce Breneman
*Assistant Examiner*—George Goudreau
*Attorney, Agent, or Firm*—Blakely, Sokoloff, Taylor & Zafman

[57] ABSTRACT

The present invention describes a method for rounding the top corners of a sub-micron trench in a semiconductor device directly after trench formation. In one embodiment of the present invention the etch process uses an etchant made up of a carbon-fluorine gas, an argon gas, and a nitrogen gas. The combination of gases enables the rounding of the top corners of the trench directly after the trench is formed. The combination of the carbon-fluorine and nitrogen gases etch back the silicon nitride and stress relief oxide layers in order to expose the top corners of the trench. As the top corners of the substrate are exposed the nitrogen and argon gases sputter the top corners rounding them as the etch process completes the trench.

15 Claims, 4 Drawing Sheets

ETCH PROCESS TO PRODUCE ROUNDED TOP CORNERS FOR SUB-MICRON SILICON TRENCH APPLICATIONS

BACKGROUND OF THE INVENTION

1. Field of the Invention

This invention relates to the field of semiconductor devices, and more specifically, to a process for rounding the top corners during the formation of trenches with sub-micron dimensions.

2. Background Information

As semiconductor devices shrink ever smaller, so must its circuitry (components) such as trenches, contacts, plugs, vias, and interconnect lines. For example, in the current generation of semiconductor devices, the density of the circuitry (components) have become so compact that the dimensions of these components have decreased below submicron dimensions ($\leq 1$ micron).

A consequence of the smaller devices and the increasing density of the components on these devices is that it becomes increasingly more important to control the critical dimensions of these components. As the dimensions for these components become even smaller and spaced relatively closer, for example, less than 0.5 micron (<0.5 $\mu$) and even less than 0.25 micron (<0.25 $\mu$), the processes used to make such components become less reliable and are unable to control the critical dimensions (CDs) of such components. If the critical dimensions of such components are not controlled, some of the components may be shorted together and consequently the semiconductor device being fabricated may not function properly.

In order to control the critical dimensions of these components, the processes used to manufacture these components should have good etch selectivity (to photoresists, metals, etc.). Prior art processes have the ability to control the critical dimensions within acceptable tolerance ranges for components with dimensions greater than approximately 1 micron (>1 $\mu$). However, as the dimensions decrease below this level, i.e. at or below 1 $\mu$, these processes do not provide sufficient control over the critical dimensions due to poor etch bias control.

FIG. 1a–1c illustrate the generic or well known process steps for photolithographic and masking techniques used to form trenches. It should be noted that the figures are merely illustrative and have been simplified for clarity purposes and that similar processes may be used to form more complex structures. FIG. 1a illustrates a substrate 100 with an oxide layer 110 and a polish stop layer (or an etch hard mask layer) 120 deposited thereon. In FIG. 1b, a photoresist layer 130 has been spun above polish stop layer (or an etch hard mask layer) 120 and is exposed to light through mask layer 140. After photoresist layer 130 has been exposed to light, mask layer 140 is removed and photoresist layer 130 is developed in a developing solution to remove the portions of the photoresist layer 130 that were exposed to light. FIG. 1c illustrates photoresist layer 130 after the soluble portions of photoresist layer 130 have been removed.

It should be noted that, although the above description describes positive resist techniques, it will be obvious to one with ordinary skill in the art, that negative resist techniques may also be used to pattern trenches. It should also be noted and it will be obvious to one with ordinary skill in the art, that some manufacturers may pattern and use etch hard mask layer 120 to define the critical dimensions of the trench rather than using a photoresist. Although the following description describes the use of a photoresist, it will be obvious to one with ordinary skill in the art that other trench formation processes may be performed in a similar manner using an etch hard mask layer. The processing steps for using an etch hard mask layer 120 instead of a photoresist to pattern the trench are similar to those described above with regard to the use of the photoresist (e.g. patterning, etching, etc.), however are not described in detail herein.

Once the soluble portions of photoresist layer 130 have been removed, polish stop layer (or etch hard mask layer) 120, oxide layer 110, and substrate 100 are etched to form an opening 150, in order to create a trench. After the trench, or opening 150 is completely etched then the photoresist layer 130 is removed.

A problem, as devices become smaller, is that the component edges, for example the top corners of a trench, tend to carry stronger electromagnetic fields (e-fields). As illustrated in FIG. 1e, after the trench is formed and the oxide layer 110 and polish stop layer (or etch hard mask) 120 are removed, the top corners 160 of the trench are sharp. Sharp top corners 160 of the trench cause problems when later forming active regions on either side of the trench. For example, when forming a transistor to the side of the trench a gate insulating oxide layer 170 is deposited over the substrate, see for example FIG. 1f. Because top corners 160 are sharp, the gate oxide layer 170 cannot be deposited with a uniform thickness. As illustrated in FIG. 1f, the thickness 180 of the gate oxide layer 170 around the top corners 160 becomes very thin. The thin gate oxide layer may break down if subjected to high electromagnetic field. For example, once a transistor is formed and is functioning the sharp top corners 160 create a high e-field and the thin gate oxide 180 may be subject to failure causing undesirable parasitic capacitances and leakage voltages which degrade device performance.

Sharp top corners also cause a problem when filling the trench. The trench is generally filled using chemical vapor deposition (CVD) techniques to fill the trench with materials such as an oxide, polysilicon, or a combination thereof. CVD processes subject the structure to plasma which also induces (or creates) an electric field around the sharp corners causing a non-uniform deposition process and may create gaps or voids in the trench fill.

Some prior art processes deal with these problems by rounding the top corners 160 so that they will not be as sharp and will allow for a more uniform deposition of oxide. For example, as illustrated in FIGS. 2a–2c, one such process uses a sacrificial oxide layer 290 to round the top corners 260 of the trench. The sacrificial oxide layer 290 is deposited on the trench surface at high temperatures. The oxide reacts to consume the silicon trench surface. During consumption, the trench corner is rounded, thus forming curved (or rounded) top edges 265, as illustrated in FIG. 2b. As shown in FIG. 2c, when a gate oxide layer 270 is then deposited the rounded top corners 265 allow uniform deposition of the gate oxide layer 270 such that the thickness of the gate oxide layer at the trench edges 280 is the same as on the surface.

The problem associated with using edge rounding techniques, such as the sacrificial oxide technique discussed above, is that while rounding the top corners, the trench is also consumed, such that the finished trench will not only have rounded top corners but will also have a positive etch bias (i.e. the trench gets larger than originally planned.) Thus, some of the rounding techniques sacrifice the etch bias control and consequently the critical dimension of the trench. In addition, sacrificial oxide techniques take a very long time and slow down the overall manufacturing process.

Another prior art technique is to use an Argon sputtering process in order to round the top corners of the nitride layer. One problem with an argon sputtering is that it only rounds the nitride layer and not the underlying silicon or oxide layers. For applications where the nitride layer is permanent for use as a polish stop layer, the use of an argon sputter technique to round the top corners of the silicon and/or oxide layers would take an extremely long time and would significantly slow down the throughput of the system.

Thus, what is needed is a method for forming trenches with rounded top corners without significantly sacrificing the critical dimensions of the trench or decreasing the throughput of the fabrication process.

SUMMARY OF THE INVENTION

The present invention describes a method for rounding the top corners of a trench in a semiconductor device directly after the trench is formed. One embodiment of the present invention performs a plasma etch step to round the top corners of the trench, wherein the etchants used to round the top corners of the trench comprise a carbon-fluorine gas, an argon gas, and a nitrogen gas.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

An Etch Process to Produce Rounded Top Corners for Sub-Micron Silicon Trench Applications is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for rounding the top corners of a trench in a semiconductor device directly after the trench is formed. In the manufacture of semiconductor devices, and more specifically when forming trenches, the present invention is employed in order to round the top corners without requiring low throughput processing steps and without sacrificing the control over the critical dimensions of the opening, thus allowing the trenches to be spaced relatively close to other semiconductor devices without degrading the electrical performance of the semiconductor device.

When forming a semiconductor device, circuits often need to be formed to be electrically isolated from one device to another device or devices. One method for forming these circuit isolation regions is to form trenches or openings in the substrate overlying, underlying, adjoining, etc. the devices which are to be isolated. These openings are then filled with a non-conductive material to form an isolation trench. In one embodiment of the present invention, for example, the trenches are formed in a trilayer structure that is made of an oxide layer grown above a substrate with a polish stop or an etch hard mask layer deposited above the oxide layer. It should be noted and it will be obvious to one with ordinary skill in the art that other structures and materials may be used in which to form trenches.

Figure 1A:
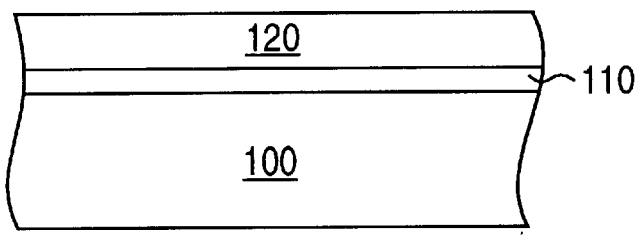
FIG. 1a illustrates a cross-sectional view of a substrate with an oxide layer and a polish stop layer deposited thereon.
Figure 1B:
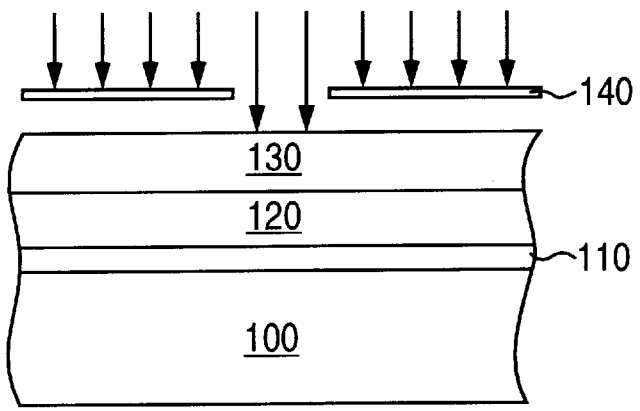
FIG. 1b illustrates a cross-sectional view of a mask and a photoresist layer coated on the polish stop layer of FIG. 1a during exposure to light.
Figure 1C:
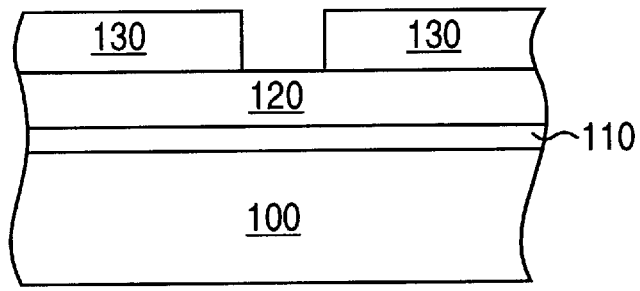
FIG. 1c illustrates a cross-sectional view of the photoresist layer of FIG. 1b after patterning.
Figure 1D:
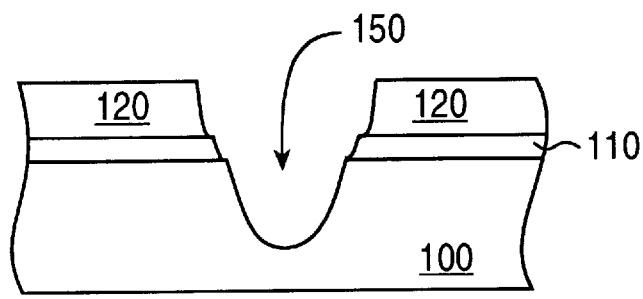
FIG. 1d illustrates a cross-sectional view of the structure of FIG. 1c after etching a trench using prior art processes.
Figure 1E:
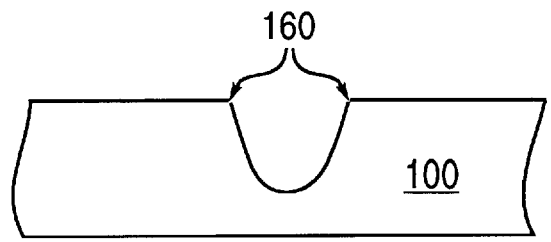
FIG. 1e illustrates a cross-sectional view of the sharp top corners of the trench formed using prior art processes of FIG. 1d.
Figure 1F:
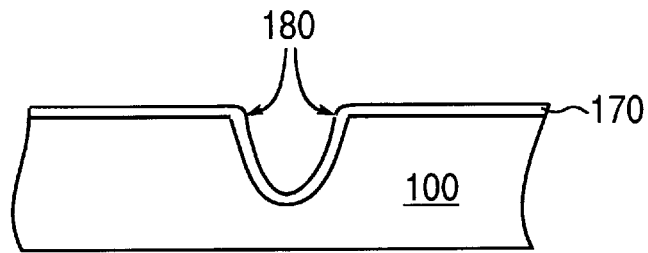
FIG. 1f illustrates a cross-sectional view of the structure of FIG. 1e after depositing a gate oxide layer.
Figure 2A:
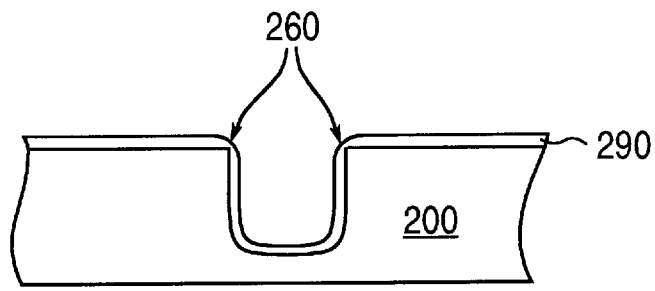
FIG. 2a illustrates a cross-sectional view of a trench having a sacrificial oxide deposited thereon.
Figure 2B:
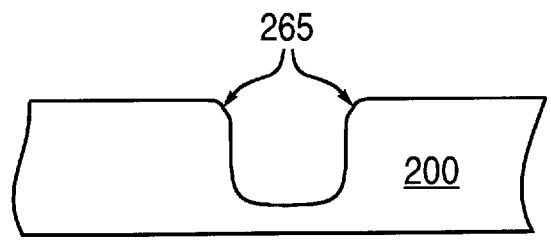
FIG. 2b illustrates a cross-sectional view of the structure in FIG. 2a after the sacrificial oxide layer has been removed.
Figure 2C:
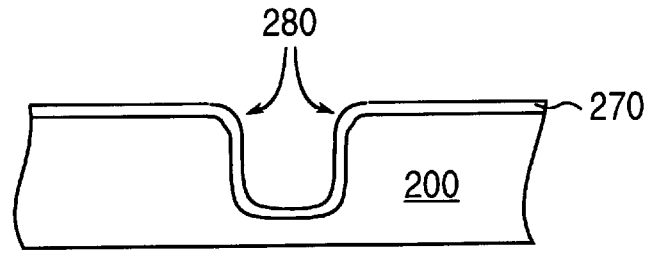
FIG. 2c illustrates a cross-sectional view of the structure in FIG. 2b after depositing a gate oxide layer.

A trench is formed by etching an opening into the structure. It should be noted, and it will be obvious to one with ordinary skill in the art, that the photolithographic and masking techniques and etch hard mask or polish stop layer techniques used to form a trench are well known in the art and are therefore not described in detail. A general example of such processes has been discussed above in the background of the invention and is illustrated in FIGS. 1a–1c. It should also be noted that the photolithographic processes and masking steps, as illustrated in FIGS. 1a–1c or alternatively the etch hard mask or polish stop layer techniques may be used with respect to the present invention but are not repeated or shown in the following detailed description of FIGS. 3a–3e.

The present invention rounds the top corners of the trench, however, it should be noted that the present invention may be used in conjunction with other trench formation methods, for example, the present invention may be used in conjunction with the techniques described in co-pending patent application titled, "Method of Controlling Etch Bias with a Fixed Lithography Pattern for Sub-Micron Critical Dimension Shallow Trench Applications," which is assigned to the assignee herein.

Figure 4:
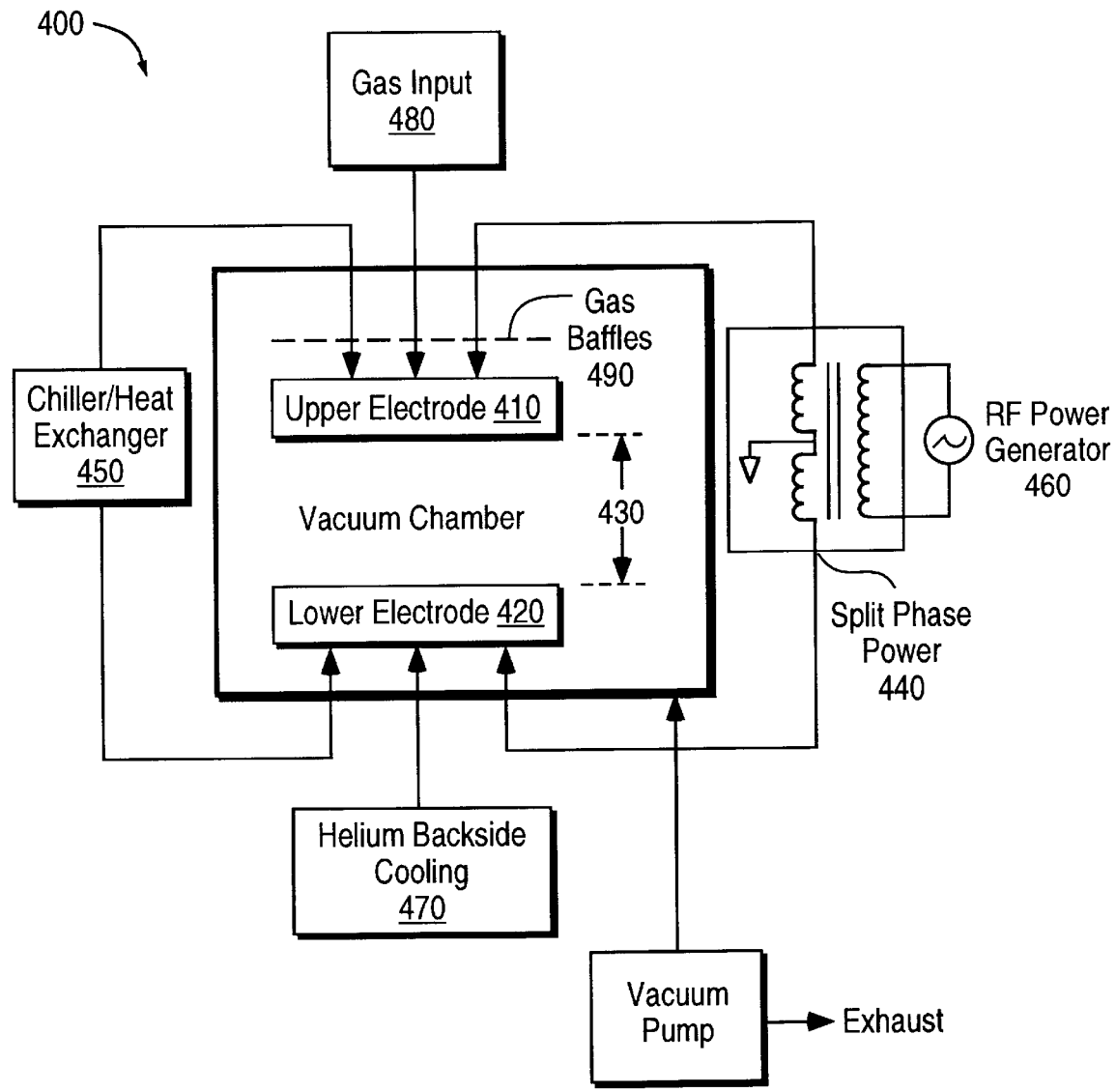
FIG. 4 illustrates a schematic of one embodiment of a low density parallel plate etch reactor that may be used in the present invention.

The trench corner rounding etch process of one embodiment of the present invention is performed in a low density parallel plate etch reactor, for example the Rainbow 4500 Oxide Etcher (Rainbow 4500) available from LAM Research Corporation, in San Jose, Calif. A schematic of a Rainbow 4500 Oxide Etcher is illustrated in FIG. 4. Although the present invention is described below with reference to the Rainbow 4500 it will be obvious to one with ordinary skill in the art that the present invention may be practiced using other similar reactors. For example, the etch process may be performed using other oxide etchers such as the Applied Materials Centura Etcher, Tokyo Electron Limited Etcher 8500 DRM, Tegal Oxide Etchter, etc.

The present invention uses an etch recipe that enables the rounding of the top corners due to the particular etch chemistries used. The etch chemistry of the present invention laterally etches (or etches back) the nitride layer exposing the underlying top corners of the oxide and silicon layers so that they may be rounded. The etch chemistry uses a combination of argon and nitrogen gases in a carbon-fluorine based etchant. The carbon-fluorine and nitrogen/argon react together to laterally and downwardly etchback the nitride layer while the nitrogen and argon induce sputtering thus rounding the top corners of the silicon and oxide layers of the trench.

Figure 3A:
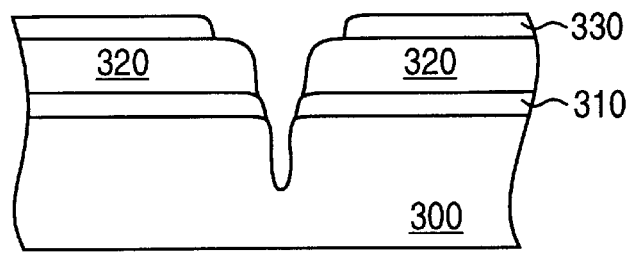
FIG. 3a illustrates a cross-sectional view of a substrate having an oxide layer, a polish stop layer, and a patterned photoresist deposited thereon during the beginning of an etch step of the present invention.
Figure 3B:
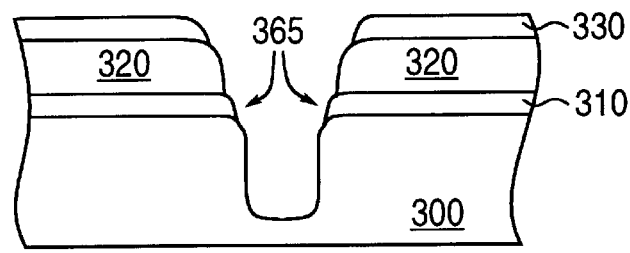
FIG. 3b illustrates a cross-sectional view of the structure in FIG. 3a after a longer duration of the etch step of the present invention.

FIG. 3a illustrates a substrate 300 with an stress relief oxide layer 310 and a polish stop layer (or etch hard mask layer) 320 deposited thereon. Also illustrated in FIG. 3a is a photoresist layer 330 which has been patterned to print a trench having sub-micron dimensions. In one embodiment substrate 300 may be made of silicon or polysilicon. Stress relief oxide layer 310 may be made of a stress relief oxide, for example silicon dioxide. Polish stop layer 320, which may be used alternatively as an etch hard mask or polish stop layer 320, may be made of a nitride, for example silicon nitride. It should be noted and it will be obvious to one with ordinary skill in the art, that the structure illustrated in FIGS. 3a–3e may be made of other materials, layers, etc. The trench is formed via any standard method, for example the present invention may be used in conjunction with the techniques described in the co-pending patent application titled, "Method of Controlling Etch Bias with a Fixed Lithography Pattern for Sub-Micron Critical Dimension Shallow Trench Applications," referred to above.

Figure 3C:
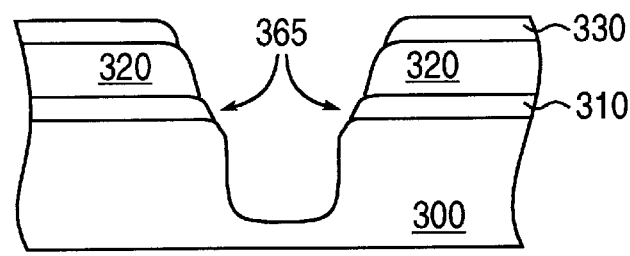
FIG. 3c illustrates a cross-sectional view of the structure in FIG. 3b after the etch step of the present invention is completed.

In the present invention as illustrated in FIG. 3c, the polish stop layer 320 is laterally pulled back even further at a faster rate than the stress relief oxide layer 310, which in turn is also pulled back to reveal the substrate 300. Thus, as the polish stop layer and the oxide layers are pulled back (due to the reaction of the carbon-fluorine gas) the corners of the substrate 300 are exposed to the etch chemistry which rounds the corners (due to the nitrogen and argon induced sputtering) as the etch process takes place.

It should be noted that the rounding of the top corners may be controlled by changing the amount of the carbon-fluorine based etchant used in the particular recipe. For example, if more rounding is desired a larger amount of the carbon-fluorine based etchant may be used in order to etchback the polish stop layer 320 and the stress relief oxide layer 310 at a faster rate, thereby exposing the top corners 365 of substrate 300 earlier in the rounding process. Alternatively, if less rounding is desired then a smaller amount of the carbon-fluorine based etchant may be used in order to etch back the polish stop layer 320 and the stress relief oxide layer 310 at a slower rate, thereby delaying the exposure of the top corners 365 of substrate 300 until later in the etch process.

Figure 3D:
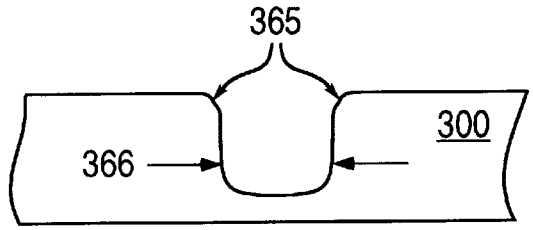
FIG. 3d illustrates a cross-sectional view of the structure in FIG. 3c after the oxide layer, a polish stop layer, and photoresist have been removed.

FIG. 3d illustrates the trench should the stress relief oxide layer 310, polish stop layer (or etch hard mask) 320, and photoresist 330 be removed. Top corners 365 are rounded, however, the critical dimensions of the trench are not sacrificed. Comparing the width 366 of the trench in FIG. 3d with the patterned photoresist of FIG. 3a it can be seen that the critical dimensions and the etch bias may still be controlled using the present invention. Thus, the present invention does not degrade device density as opposed to the standard sacrificial oxide layer technique described earlier.

Figure 3E:
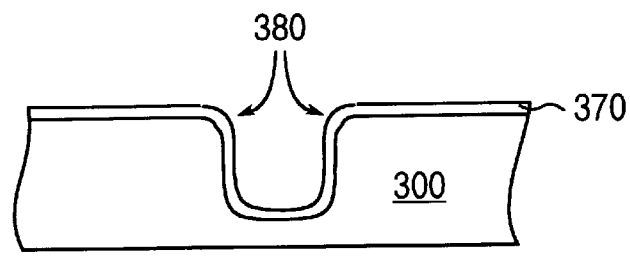
FIG. 3e illustrates a cross-sectional view of the structure in FIG. 3d after depositing a gate oxide layer.

FIG. 3e illustrates the trench after a gate oxide layer 370 has been deposited. Rounded top corners 365 allow a more uniform deposition of the gate oxide layer 370 such that the thickness of the gate oxide layer at the trench edges 380 is the same as on the surface of the substrate 300. Therefore, when an active region is formed the gate oxide is not subjected to high electric fields and is less likely to degrade the device performance.

The etch recipe of the present invention enables the etchback of polish stop layer 320 and stress relief oxide layer 310 to expose the silicon layer much sooner than if only an argon sputter is used. This is due also in part to the high power density of the particular etch reactor being used. As stated earlier, FIG. 4 illustrates a low density parallel plate reactor 400 that may be used for the etch process of the present invention. In one embodiment of the present invention the power of the reactor used in the etch process is in the range of approximately 1000–1800 watts. Such a power range causes the argon and nitrogen sputtering that rounds the top corners of the trench formed in the semiconductor substrate. Upper electrode 410 and lower electrode 420 operate in the present invention with a gap spacing 430 in the range of approximately 1–1.2 cm. The electrode temperatures are maintained at a temperature in the range of approximately 0.1°–20° C. using chiller/heat exchanger 450. RF power generator 460 operates at an RF frequency in the range of approximately 200 kilohertz (kHz) to 13.56 megahertz (MHz).

In the present invention, the etch process is performed at a pressure in the range of approximately 100–300 mTorr with a helium backside cooling (470) pressure in the range of approximately 10–20 Torr. It should be noted that helium backside cooling is a process for cooling the backside of a wafer (or substrate) wherein helium is pumped into the gap between the wafer and lower electrode 420, thus cooling the backside of the wafer. The etch chemistry of the present invention is delivered to the reactor 400 through gas input 480 and gas baffles 490. Nitrogen gas and argon gas are delivered at a gas flow in the range of approximately 20–100 sccm and 100–500 sccm, respectively. The trench is etched using carbon-fluorine based etchants, for example $CF_4$. In one embodiment of the present invention the $CF_4$ gas is delivered to the reactor at a gas flow in the range of approximately 1–100 sccm.

It should be noted and it will be obvious to one with ordinary skill in the art that other carbon-fluorine based etchants may also be used. For example, $C_2F_6$, $CHF_3$, $C_4F_8$, or any combination thereof, etc. may be used in place of or in combination with the $CF_4$ gas.

Thus, An Etch Process to Produce Rounded Top Corners for Sub-Micron Silicon Trench Applications has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for rounding the top corners of a trench in a semiconductor device comprising:

performing an etch step to round the top corners of said trench while maintaining critical dimension control, wherein the etchant used during said etch step comprises: a carbon-fluorine gas, an argon gas, and a nitrogen gas, such that the top corners of said trench are rounded at the same time said trench is formed.

2. The method as described in claim 1 wherein said trench is formed in a substrate which is selected from the group consisting of: silicon and polysilicon.

3. The method as described in claim 1 wherein said etch step is performed in a low density parallel plate etch reactor.

4. The method as described in claim 1 wherein said carbon-fluorine gas comprises a $CF_4$ gas.

5. The method as described in claim 4 wherein said $CF_4$ gas is delivered at a gas flow in the range of approximately 1–100 sccm.

6. The method as described in claim 5 wherein said etch step is performed at:

a forward power of approximately 1000–1800 watts;

an RF frequency in the range of approximately 200 kHz – 13.56 MHz;

a pressure in the range of approximately 100–300 mTorr;

a gap spacing in the range of approximately 1–1.2 cm;

an argon gas flow rate in the range of approximately 100–500 sccm;

a nitrogen gas flow rate in the range of approximately 20–100 sccm;

a helium backside cooling pressure in the range of approximately 10–20 Torr; and an electrode temperature in the range of approximately 0.1°–20° C.

7. A method for forming rounded top trench corners in a semiconductor device comprising:

providing a substrate;

depositing a silicon nitride layer above said substrate;

performing an etch step to form said trench and maintain critical dimension control, wherein the etchant used during said etch step comprises: a carbon-fluorine gas, an argon gas, and a nitrogen gas, wherein said etch step laterally etches said silicon nitride layer exposing the top corners of said trench in said substrate such that said top corners of said trench are rounded at the same time said trench is formed.

8. The method as described in claim 7 further comprising the step of: depositing an oxide layer, wherein said oxide layer is deposited above said substrate and said silicon nitride layer is deposited above said oxide layer.

9. The method as described in claim 7 wherein said silicon nitride layer is used as an etch hard mask, said method further comprising the step of:

patterning said etch hard mask layer.

10. The method as described in claim 7 further comprising the steps of:

depositing a photoresist above said silicon nitride layer; and patterning said photoresist prior to said step of performing an etch.

11. The method as described in claim 1 wherein said substrate is selected from the group consisting of: silicon and polysilicon.

12. The method as described in claim 7 wherein said etch step is performed in a low density parallel plate etch reactor.

13. The method as described in claim 7 wherein said carbon-fluorine gas comprises a $CF_4$ gas.

14. The method as described in claim 13 wherein said $CF_4$ gas is delivered at a gas flow in the range of approximately 1–100 sccm.

15. The method as described in claim 14 wherein said etch step is performed at:

a forward power of approximately 1000–1800 watts;

an RF frequency in the range of approximately 200 kHz – 13.56 MHz;

a pressure in the range of approximately 100–300 mTorr;

a gap spacing in the range of approximately 1–1.2 cm;

an argon gas flow rate in the range of approximately 100–500 sccm;

a nitrogen gas flow rate in the range of approximately 20–100 sccm;

a helium backside cooling pressure in the range of approximately 10–20 Torr; and an electrode temperature in the range of approximately 0.1°–20° C.

* * * * *